US012751048B2

(12) United States Patent
Sasaki et al.

(10) Patent No.: US 12,751,048 B2
(45) Date of Patent: Sep. 29, 2026

(54) SEMICONDUCTOR ELEMENT AND PRODUCTION METHOD FOR SAME

(71) Applicants: TAMURA CORPORATION, Tokyo (JP); National Institute of Information and Communications Technology, Koganei (JP)

(72) Inventors: Kohei Sasaki, Tokyo (JP); Masataka Higashiwaki, Koganei (JP); Man Hoi Wong, Koganei (JP)

(73) Assignees: Tamura Corporation, Tokyo (JP); National Institute of Information and Communications Technology, Tokyo (JP)

( * ) Notice: Subject to any disclaimer, the term of this patent is extended or adjusted under 35 U.S.C. 154(b) by 0 days.

(21) Appl. No.: 15/507,169

(22) PCT Filed: Aug. 6, 2015

(86) PCT No.: PCT/JP2015/072432
§ 371 (c)(1),
(2) Date: Feb. 27, 2017

(87) PCT Pub. No.: WO2016/031522
PCT Pub. Date: Mar. 3, 2016

(65) Prior Publication Data
US 2017/0288061 A1 Oct. 5, 2017

(30) Foreign Application Priority Data
Aug. 29, 2014 (JP) ................................ 2014-175915

(51) Int. Cl.
*H10D 30/67* (2025.01)
*H01L 21/02* (2006.01)
(Continued)

(52) U.S. Cl.
CPC ....... *H10D 30/6755* (2025.01); *H10D 30/027* (2025.01); *H10D 30/60* (2025.01);
(Continued)

(58) Field of Classification Search
CPC ......... H01L 29/7869; H01L 21/823807; H01L 29/0696; H01L 27/0925; H01L 21/02565;
(Continued)

(56) References Cited

U.S. PATENT DOCUMENTS 5,072,267 A * 12/1991 Hattori ................ H01L 27/0925
257/E29.256
8,951,897 B2 2/2015 Sasaki
(Continued)

FOREIGN PATENT DOCUMENTS

CN 103782392 A 5/2014
JP S61-187329 A 8/1986
(Continued)

OTHER PUBLICATIONS

International Search Report (ISR) (PCT Form PCT/ISA/210), in PCT/JP2015/072432, dated Oct. 6, 2015.
(Continued)

*Primary Examiner* — Samuel A Gebremariam
*Assistant Examiner* — Jonas T Beardsley
(74) *Attorney, Agent, or Firm* — MCGINN INTELLECTUAL PROPERTY LAW GROUP, PLLC

(57) ABSTRACT

A semiconductor element includes a high-resistivity substrate that includes a β-$Ga_2O_3$-based single crystal including an acceptor impurity, an undoped β-$Ga_2O_3$-based single crystal layer formed on the high-resistivity substrate, and an n-type channel layer that includes a side surface surrounded by the undoped β-$Ga_2O_3$-based single crystal layer. The undoped β-$Ga_2O_3$-based single crystal layer includes an element isolation region.

9 Claims, 8 Drawing Sheets

(51) Int. Cl.

| | |
|---|---|
| ***H10D 30/01*** | (2025.01) |
| ***H10D 30/60*** | (2025.01) |
| ***H10D 30/87*** | (2025.01) |
| ***H10D 62/10*** | (2025.01) |
| ***H10D 62/40*** | (2025.01) |
| ***H10D 62/80*** | (2025.01) |
| ***H10D 86/40*** | (2025.01) |
| ***H10D 86/60*** | (2025.01) |
| ***H10D 99/00*** | (2025.01) |
| *H10P 14/20* | (2026.01) |

(52) U.S. Cl.
CPC ......... *H10D 30/6725* (2025.01); *H10D 30/87* (2025.01); *H10D 30/875* (2025.01); *H10D 62/113* (2025.01); *H10D 62/80* (2025.01); *H10D 86/423* (2025.01); *H10D 86/60* (2025.01); *H10D 99/00* (2025.01); *H10D 62/405* (2025.01); *H10P 14/2918* (2026.01); *H10P 14/2926* (2026.01); *H10P 14/3434* (2026.01); *H10P 14/3466* (2026.01)

(58) Field of Classification Search
CPC ............... H01L 29/24; H01L 29/66969; H01L 21/02414; H01L 29/78; H01L 27/0927; H01L 27/0928; H10D 62/80; H10D 30/60; H10D 30/6755
See application file for complete search history.

(56) References Cited

U.S. PATENT DOCUMENTS

| | | | | |
|---|---|---|---|---|
| 9,202,876 | B2 | 12/2015 | Sasaki | |
| 9,437,689 | B2 | 9/2016 | Sasaki et al. | |
| 10,161,058 | B2 | 12/2018 | Sasaki | |
| 10,249,767 | B2 | 4/2019 | Sasaki et al. | |
| 10,633,761 | B2 | 4/2020 | Sasaki | |
| 2004/0132249 | A1* | 7/2004 | Mitsuda | H01L 21/02063 438/260 |
| 2007/0187797 | A1* | 8/2007 | Kato | H01L 21/823807 257/500 |
| 2011/0198612 | A1* | 8/2011 | Malhan | H01L 29/66068 257/77 |
| 2013/0234135 | A1 | 9/2013 | Mochizuki et al. | |
| 2014/0217405 | A1 | 8/2014 | Sasaki et al. | |
| 2014/0217469 | A1* | 8/2014 | Sasaki | H10D 62/60 257/192 |
| 2014/0217470 | A1 | 8/2014 | Sasaki et al. | |
| 2014/0217471 | A1 | 8/2014 | Sasaki et al. | |
| 2014/0217554 | A1 | 8/2014 | Sasaki | |
| 2014/0220734 | A1 | 8/2014 | Sasaki | |
| 2014/0239452 | A1 | 8/2014 | Sasaki | |
| 2014/0331919 | A1* | 11/2014 | Sasaki | H01L 21/02631 117/108 |
| 2015/0115279 | A1 | 4/2015 | Sasaki | |
| 2015/0263092 | A1* | 9/2015 | Hsiao | H01L 21/30604 257/77 |
| 2016/0017512 | A1* | 1/2016 | Sasaki | C30B 13/32 125/30.01 |
| 2016/0300953 | A1 | 10/2016 | Sasaki et al. | |
| 2019/0062942 | A1 | 2/2019 | Sasaki | |

FOREIGN PATENT DOCUMENTS

| | | | |
|---|---|---|---|
| JP | H 11-097519 | A | 4/1999 |
| JP | 5536920 | B1 | 7/2014 |
| WO | 2013/035465 | A1 | 3/2013 |

OTHER PUBLICATIONS

Notification of Transmittal of Translation of the International Preliminary Report on Patentability (PCT/IB/338) in PCT Application No. PCT/JP2015/072432 dated Mar. 9, 2017.
Chinese Office Action, dated Aug. 22, 2019, in Chinese Application No. 201580046342.X and English Translation thereof.
German Office Action, dated Dec. 11, 2019, in German Application No. 11 2015 003 970.8 and English Translation thereof.
German Patent Office Summons to attend Hearing issued Jul. 12, 2023, for German Patent Application No. 112015003970.8.
Japanese Office Action dated Dec. 16, 2015 in Japanese Patent Application No. 2014-175915 with machine English translation.

* cited by examiner

SEMICONDUCTOR ELEMENT AND PRODUCTION METHOD FOR SAME

TECHNICAL FIELD

The invention relates to a semiconductor element and a production method for the same, in particular, to a β-$Ga_2O_3$-based semiconductor element and a production method for the same.

BACKGROUND ART

In conventional semiconductor elements, an element isolation structure is used to electrically isolate elements arranged on a semiconductor laminate. This type of element isolation structure is formed by, e.g., an element isolation process using ion implantation of acceptor impurity (see, e.g., PTL 1).

In the conventional semiconductor device described in PTL 1, a $p^+$-type channel stop layer for element isolation is formed in an element isolation region on a surface of a p-type silicon substrate.

CITATION LIST

Patent Literature

[PTL 1]
JP-A-H11-97519

SUMMARY OF INVENTION

Technical Problem

In the element isolation using the acceptor impurity ion implantation, a high dose of acceptor impurity ions is implanted from the upper surface of the element isolation region to a deep position to reach the substrate. Therefore, implantation time is long and this makes manufacturing process longer, resulting in that production takes long time and also it is difficult to reduce the production cost.

Therefore, it is an object of the invention to provide a semiconductor element and a production method thereof which allow production steps to be simplified and production costs to be reduced.

By the way, with regard to nitride-based semiconductors and oxide-based semiconductors such as β-$Ga_2O_3$ etc., it is assumed that undoped crystals thereof become n-type. This is because the cleaning effect of raw materials and apparatuses is limited so that it is difficult to completely prevent the unintentional contamination of donor impurities. Also, another reason is that crystal defects such as holes may frequently function as a donor and it is difficult to completely remove the crystal defects.

The present inventors have keenly studied the undoped crystals, and have thereby found that β-$Ga_2O_3$-based single crystals can be easily grown by the generally known crystal growth methods so as to be high-resistivity undoped crystals and unexpectedly that the above object can be attained by using the undoped crystals for the element isolation so as to complete the present invention.

To achieve the above object, the invention provides a semiconductor element defined by [1] to [12] below and a production method for a semiconductor element defined by [13] to [15] below.

[1] A semiconductor element, comprising: a high-resistivity substrate that comprises a β-$Ga_2O_3$-based single crystal including an acceptor impurity; an undoped β-$Ga_2O_3$-based single crystal layer formed on the high-resistivity substrate; and an n-type channel layer that comprises a side surface surrounded by the undoped β-$Ga_2O_3$-based single crystal layer, wherein the undoped β-$Ga_2O_3$-based single crystal layer comprises an element isolation region.

[2] A semiconductor element, comprising: a high-resistivity substrate that comprises a β-$Ga_2O_3$-based single crystal comprising an acceptor impurity; an undoped β-$Ga_2O_3$-based single crystal layer formed on the high-resistivity substrate; and an n-type channel layer that comprises a side surface and a bottom surface on a side of the substrate that are surrounded by the undoped β-$Ga_2O_3$-based single crystal layer, wherein the undoped β-$Ga_2O_3$-based single crystal layer comprises an element isolation region.

[3] The semiconductor element according to [1] or [2], wherein the undoped β-$Ga_2O_3$-based single crystal layer is a region that includes an unintentional donor and/or acceptor impurity at a concentration of less than $1\times10^{15}$ $cm^{-3}$.

[4] The semiconductor element according to [1] or [2], wherein a concentration of a donor impurity doped into the n-type channel layer is set to be higher than a concentration of an acceptor impurity of the undoped β-$Ga_2O_3$-based single crystal layer.

[5] The semiconductor element according to [1] or [2], comprising a MESFET or MOSFET.

[6] The semiconductor element according to [1] or [2], comprising an undoped region between an n-type channel region and an n-type channel region.

[7] The semiconductor element according to [1] or [2], wherein the undoped β-$Ga_2O_3$-based single crystal layer is located between the high-resistivity substrate and the n-type channel layer.

[8] A semiconductor element, comprising: a high-resistivity substrate that comprises a β-$Ga_2O_3$-based single crystal including an acceptor impurity; a low-concentration acceptor impurity-including β-$Ga_2O_3$-based single crystal layer formed on the high-resistivity substrate; and an n-type channel layer that comprises a side surface and a bottom surface on a side of the substrate that are surrounded by the low-concentration acceptor impurity-including β-$Ga_2O_3$-based single crystal layer, wherein the low-concentration acceptor impurity-including β-$Ga_2O_3$-based single crystal layer comprises an element isolation region.

[9] The semiconductor element according to [8], wherein the low-concentration acceptor impurity-including β-$Ga_2O_3$-based single crystal layer comprises a region that includes the acceptor impurity diffused from the high-resistivity substrate at a concentration of less than $1\times10^{16}$ $cm^{-3}$.

[10] The semiconductor element according to [8] or [9], wherein a donor concentration of the low-concentration acceptor impurity-including β-$Ga_2O_3$-based single crystal layer is set to be lower than a concentration of the acceptor impurity diffused from the high-resistivity substrate, and wherein a concentration of a donor impurity doped into the n-type channel layer is higher than a concentration of an acceptor impurity of the low-concentration acceptor impurity-including β-$Ga_2O_3$-based single crystal layer.

[11] The semiconductor element according to [8] or [9], wherein the low-concentration acceptor impurity-including β-$Ga_2O_3$-based single crystal layer comprises a region that includes an intentionally doped acceptor impurity at a concentration of less than $1\times10^{16}$ $cm^3$.

[12] The semiconductor element according to [8], wherein the n-type channel layer comprises a side surface and a bottom surface on a side of the substrate that are surrounded by the acceptor impurity-including $\beta$-$Ga_2O_3$-based single crystal layer of a same element and a same concentration.

[13] A production method for a semiconductor element, comprising: a step of forming an undoped $\beta$-$Ga_2O_3$-based single crystal layer on a high-resistivity substrate that comprises a $\beta$-$Ga_2O_3$-based single crystal including an acceptor impurity; and a step of forming an n-type channel layer by doping a donor impurity into a predetermined region of the undoped $\beta$-$Ga_2O_3$-based single crystal layer such that a side surface thereof is surrounded by the undoped $\beta$-$Ga_2O_3$-based single crystal layer, wherein the undoped $\beta$-$Ga_2O_3$-based single crystal layer comprises an element isolation region.

[14] A production method for a semiconductor element, comprising: a step of forming a low-concentration acceptor impurity-including $\beta$-$Ga_2O_3$-based single crystal layer on a high-resistivity substrate that comprises a $\beta$-$Ga_2O_3$-based single crystal including an acceptor impurity; and a step of forming an n-type channel layer by doping a donor impurity into a predetermined region of the low-concentration acceptor impurity-including $\beta$-$Ga_2O_3$-based single crystal layer such that a side surface and a bottom surface on a side of the substrate are surrounded by the low-concentration acceptor impurity-including $\beta$-$Ga_2O_3$-based single crystal layer, wherein the low-concentration acceptor impurity-including $\beta$-$Ga_2O_3$-based single crystal layer comprises an element isolation region.

[15] The production method for a semiconductor element according to [14], wherein the step of forming the low-concentration acceptor impurity-including a $\beta$-$Ga_2O_3$-based single crystal layer comprises a step of doping an acceptor impurity of less than $1\times10^{16}$ $cm^{-3}$ into an undoped $\beta$-$Ga_2O_3$-based single crystal layer to form the low-concentration acceptor impurity-including $\beta$-$Ga_2O_3$-based single crystal layer.

In the present invention, the undoped $\beta$-$Ga_2O_3$-based single crystal layer means a layer comprised of a $\beta$-$Ga_2O_3$-based single crystal that includes a donor impurity and/or acceptor impurity of less than $1\times10^{15}$ $cm^3$ which are not intentionally doped, and the low-concentration acceptor impurity-including $\beta$-$Ga_2O_3$-based single crystal layer means a layer comprised of a $\beta$-$Ga_2O_3$-based single crystal that includes an acceptor impurity of less than $1\times10^{16}$ $cm^{-3}$. As the low-concentration acceptor impurity-including $\beta$-$Ga_2O_3$-based single crystal layer, included are, e.g., a $\beta$-$Ga_2O_3$-based single crystal layer into which a trace amount of acceptor impurity is doped for enhancing the safety against the contamination of an unintentional donor impurity, and a $\beta$-$Ga_2O_3$-based single crystal layer which includes a trace amount of acceptor impurity diffused from a acceptor impurity doped layer (e.g., a high-resistivity substrate). Herein, the $\beta$-$Ga_2O_3$-based single crystal means a single crystal with a composition of $\beta$-$(Ga_xIn_yAl_z)_2O_3$ ($0<x\leq1$, $0\leq y<1$, $0\leq z<1$, $x+y+z=1$).

Advantageous Effect of the Invention

According to the invention, the production steps of the semiconductor element can be simplified and the production costs thereof can be reduced.

In the invention, the undoped $\beta$-$Ga_2O_3$-based single crystal can be formed with a high resistivity by the generally known crystal growth methods, e.g., HYPE (halide vapor phase epitaxy) and MBE (molecular beam epitaxy) (see [0042] described later). The semiconductor element can be configured by using for the element isolation the high-resistivity undoped $\beta$-$Ga_2O_3$-based single crystal and the low-concentration acceptor including $\beta$-$Ga_2O_3$-based single crystal doped a trace amount of acceptor impurity thereinto.

DESCRIPTION OF EMBODIMENTS

Preferred embodiments of the invention will be specifically described below in conjunction with the appended drawings.

First Embodiment (General Configuration of $Ga_2O_3$ Semiconductor Element)

Figure 1A:
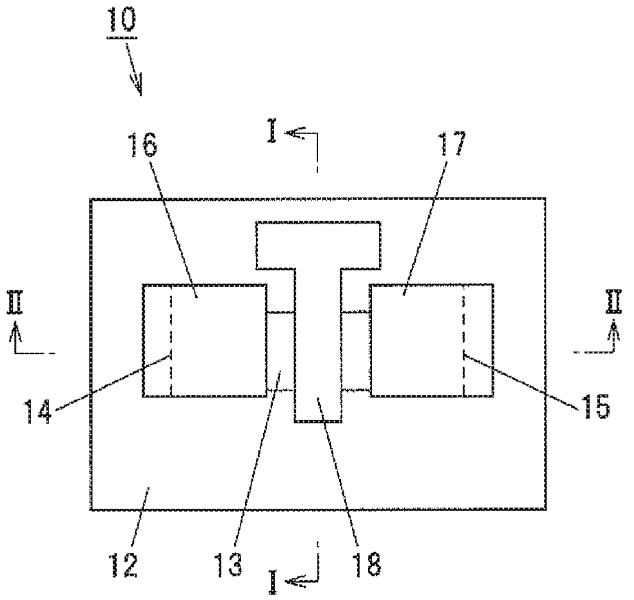
FIG. 1A is a schematic plan view showing a typical $Ga_2O_3$ MESFET in a first embodiment of the present invention.
Figure 1B:
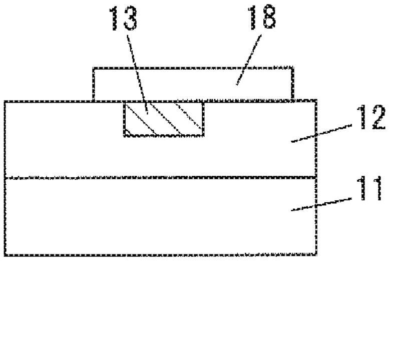
FIG. 1B is a schematic cross sectional view taken along a line I-I in FIG. 1A and viewed in an arrow direction.
Figure 2:
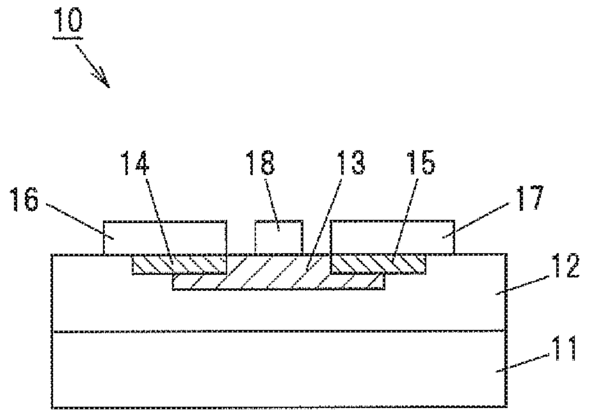
FIG. 2 is a schematic cross sectional view taken along a line II-II in FIG. 1A and viewed in an arrow direction.

FIGS. 1A to 2 show a $Ga_2O_3$-based MESFET (Metal Semiconductor Field Effect Transistor) 10 (hereinafter, simply referred to as "MESFET 10") as a $Ga_2O_3$-based semiconductor element in the first embodiment.

The MESFET 10 has an undoped or low-concentration acceptor impurity-including β-$Ga_2O_3$ single crystal layer (hereinafter, sometimes simply referred to as "β-$Ga_2O_3$ single crystal layer") 12 formed on a high-resistivity substrate 11, a channel layer 13 formed in a channel region of the β-$Ga_2O_3$ single crystal layer 12, and a source region 14 and a drain region 15 formed in predetermined regions of the β-$Ga_2O_3$ single crystal layer 12 and the channel layer 13.

The MESFET 10 also has a source electrode 16 formed on the source region 14, a drain electrode 17 formed on the drain region 15, and a gate electrode 18 formed on the channel layer 13 so as to be located between the source electrode 16 and the drain electrode 17. The β-$Ga_2O_3$ single crystal layer 12 here is a high-resistivity layer which is undoped or contains a low concentration of acceptor impurity.

(Configuration of High-Resistivity Substrate)

The high-resistivity substrate 11 is a substrate formed of a β-$Ga_2O_3$-based single crystal doped with an acceptor impurity, e.g., Fe, Be, Mg or Zn, etc., and has high-resistivity due to the doping of the acceptor impurity.

To form the high-resistivity substrate 11 doped with, e.g., Fe as an acceptor impurity, for example, a Fe-doped high-resistivity β-$Ga_2O_3$ single crystal is grown by, e.g., the EFG (Edge-defined Film-fed Growth) method and is then sliced and polished to a desired thickness.

The principal surface of the high-resistivity substrate 11 is preferably, e.g., a surface rotated not less than 50° and not more than 90° from the (100) plane of the β-$Ga_2O_3$ single crystal. In other words, an angle θ ($0<\theta\leq 90°$ formed between the principal surface of the high-resistivity substrate 11 and the (100) plane is preferably not less than 50°. Examples of the surface rotated not less than 50° and not more than 90° from the (100) plane include a (010) plane, a (001) plane, a (−201) plane, a (101) plane and a (310) plane.

When the principal surface of the high-resistivity substrate 11 is a surface rotated not less than 50° and not more than 90° from the (100) plane, it is possible to effectively suppress re-evaporation of raw materials of the β-$Ga_2O_3$ crystal from the high-resistivity substrate 11 at the time of epitaxially growing the β-$Ga_2O_3$ crystal on the high-resistivity substrate 11.

In detail, where a percentage of the re-evaporated raw material during growth of the β-$Ga_2O_3$ crystal at a growth temperature of 500° C. is defined as 0%, the percentage of the re-evaporated raw material can be suppressed to not more than 40% when the principal surface of the high-resistivity substrate 11 is a surface rotated not less than 50° and not more than 90° from the (100) plane. It is thus possible to use not less than 60% of the supplied raw material to form the β-$Ga_2O_3$ crystal, which is preferable from the viewpoint of growth rate and manufacturing cost of the β-$Ga_2O_3$ crystal.

In the β-$Ga_2O_3$ crystal, the (100) plane comes to coincide with the (310) plane when rotated by 52.5° about the c-axis and comes to coincide with the (010) plane when rotated by 90°. Meanwhile, the (100) plane comes to coincide with the (101) plane when rotated by 53.8° about the b-axis, comes to coincide with the (001) plane when rotated by 76.3° and comes to coincide with the (−201) plane when rotated by 53.8°.

The principal surface of the high-resistivity substrate 11 is, e.g., the (010) plane, or a surface rotated within an angle range of not more than 37.5° with respect to the (010) plane. In this case, a steep interface is obtained between the β-$Ga_2O_3$ single crystal layer 12 and the channel layer 13 since the surface of the β-$Ga_2O_3$ single crystal layer 12 can be flattened at the atomic level and it is more effective to prevent leakage. It is possible to prevent uneven element uptake by the β-$Ga_2O_3$ single crystal layer 12 and thereby to obtain the homogeneous β-$Ga_2O_3$ single crystal layer 12. Note that, the (010) plane comes to coincide with the (310) plane when rotated by 37.5° about the c-axis.

When (001) is the plane orientation of the principal surface of the high-resistivity substrate 11, the epitaxial growth rate of the β-$Ga_2O_3$ single crystal on the high-resistivity substrate 11 is particularly high among those plane orientations and it is possible to suppress diffusion of the acceptor impurity from the high-resistivity substrate 11 into the β-$Ga_2O_3$ single crystal layer 12 and the channel layer 13. Thus, the plane orientation of the principal surface of the high-resistivity substrate 11 is preferably (001).

(Configurations of Undoped or Low-Concentration Acceptor Impurity-Including β-$Ga_2O_3$ single crystal layer)

The undoped or low-concentration acceptor impurity-including β-$Ga_2O_3$ single crystal layer 12 is formed by epitaxially growing a β-$Ga_2O_3$ single crystal on the high-resistivity substrate 11 as a base substrate and can serve as an element isolation region which electrically isolates plural MESFETs from each other. A β-$Ga_2O_3$ single crystal formed by this epitaxial growth has an element isolation region which does not contain intentionally doped donor and acceptor impurities but contains the acceptor impurity diffused from the high-resistivity substrate 11 at a concentration of less than $1\times10^{16}$ $cm^{-3}$.

In the first embodiment, the undoped β-$Ga_2O_3$ single crystal layer 12 to be such element isolation region is a region which contains an unintentional donor and/or acceptor impurity at a concentration of less than $1\times10^{15}$ $cm^{-3}$. A trace amount of acceptor impurity, e.g., about less than $1\times10^{16}$ $cm^{-3}$ can be doped into this region to form a low-concentration acceptor impurity-including region. This can enhance the safety against the contamination of an unintentional donor impurity.

The β-$Ga_2O_3$ single crystal layer 12 can be formed by epitaxial growth using, e.g., the MBE method. The thickness of the β-$Ga_2O_3$ single crystal layer 12 is, e.g., about 10 to 10000 nm. When a Ga metal with 99.9999% purity commercially available from Koj undo Chemical Laboratory Co., Ltd. and a mixed gas of 95% oxygen and 5% ozone produced by an ozone generator are used as raw materials in this case, it is possible to obtain the undoped β-$Ga_2O_3$ single crystal layer 12 with a donor concentration of less than $1\times10^{15}$ $cm^{-3}$.

To estimate resistivity of the β-$Ga_2O_3$ single crystal layer 12, a 3 μm-thick undoped β-$Ga_2O_3$ single crystal layer was formed on a 600 μm-thick $n^+$ substrate and current-voltage characteristics were measured. The $n^+$ substrate was doped with Sn at a concentration of about $10^{18}$ $cm^{-3}$ and had a resistivity of about 0.01 Ωcm. In this measurement, a circular Pt/Ti/Au electrode having a diameter of 200 μm was formed on the β-$Ga_2O_3$ single crystal layer and also a Ti/Au electrode in ohmic contact with the $n^+$ substrate was formed on the entire lower surface of the $n^+$ substrate. A resistance value was calculated based on the result of current-voltage measurement conducted by applying voltage between the electrodes, and resistivity of the β-$Ga_2O_3$ single crystal layer was further calculated based on the thickness of the β-$Ga_2O_3$ single crystal layer, the electrode area and the obtained resistance value. The calculated resistivity of the β-$Ga_2O_3$ single crystal layer was about $2.5\times10^7$ Ωcm. In this regard, resistivity is about the same even when the β-$Ga_2O_3$ single crystal layer contains a trace amount of acceptor impurity at a concentration of about less than $1\times10^{16}$ $cm^{-3}$.

Alternatively, a β-$Ga_2O_3$-based single crystal layer, which is formed of a β-$Ga_2O_3$-based single crystal other than the β-$Ga_2O_3$ single crystal and is undoped or contains an acceptor impurity at a concentration of less than $1\times10^{16}$ $cm^{-3}$, may be used in place of the β-$Ga_2O_3$ single crystal layer 12. Resistivity of general β-$Ga_2O_3$-based single crystal layers is substantially the same as resistivity of the β-$Ga_2O_3$ single crystal layer.

(Configuration of the Channel Layer)

The channel layer 13 is an n-type layer formed of a β-$Ga_2O_3$-based single crystal containing a donor impurity. The donor impurity is, e.g., a Group IV element such as Si or Sn. The faces of the channel layer 13 except the top surface are surrounded by the undoped or low-concentration acceptor impurity-including region of the β-$Ga_2O_3$ single crystal layer 12. Meanwhile, a donor impurity is doped into the channel layer 13 by ion implantation or thermal diffusion.

(Configuration of Source Region and Drain Region)

The source region 14 and the drain region 15 are formed by doping a donor impurity, e.g., Si or Sn, etc., into the β-$Ga_2O_3$ single crystal layer 12. The doping is performed by ion implantation or thermal diffusion. The donor impurity contained in the source region 14 and the drain region 15 may be the same as or different from the donor impurity contained in the channel layer 13.

The thickness of the source region 14 and the drain region 15 is, e.g., about 150 nm. In the illustrated example, the donor impurity concentration of the source region 14 and the drain region 15 is, e.g., about $5\times10^{19}$ $cm^{-3}$ and is higher than the donor impurity concentration of the channel layer 13.

(Configuration of the Electrodes)

The source region 14 and the drain region 15 are respectively electrically connected to the source electrode 16 and the drain electrode 17. The source electrode 16, the drain electrode 17 and the gate electrode 18 are formed of, e.g., a metal such as Au, Al, Ti, Sn, Ge, In, Ni, Co, Pt, W, Mo, Cr, Cu or Pb, an alloy containing two or more of such metals, or a conductive compound such as ITO.

The source electrode 16, the drain electrode 17 and the gate electrode 18 may have a laminated structure consisting of two or more layers formed of two different metals, e.g., Ti/Al, Ti/Au, Pt/Ti/Au, Al/Au, Ni/Au or Au/Ni.

(Operation of $Ga_2O_3$ Semiconductor Element)

The MESFET 10 configured as such can be a normally-on type or a normally-off type depending on the donor concentration and the thickness of the channel layer 13 directly below the gate electrode 18.

In case that the MESFET 10 is a normally-on type, the source electrode 16 is electrically connected to the drain electrode 17 via the channel layer 13. Therefore, if a voltage is applied between the source electrode 16 and the drain electrode 17 in a state that a voltage is not applied to the gate electrode 18, a current passes through from the source electrode 16 to the drain electrode 17.

On the other hand, if a voltage is applied to the gate electrode 18, a depletion layer is formed in the channel layer 13 in a region under the gate electrode 18. A current does not pass through from the source electrode 16 to the drain electrode 17 even if a voltage is applied between the source electrode 16 and the drain electrode 17.

In case that the MESFET 10 is a normally-off type, a current does not pass through in a state that a voltage is not applied to the gate electrode 18 even if a voltage is applied between the source electrode 16 and the drain electrode 17.

On the other hand, if a voltage is applied to the gate electrode 18, the depletion layer in the channel layer 13 in the region under the gate electrode 18 is narrowed. A current passes through from the source electrode 16 to the drain electrode 17 if a voltage is applied between the source electrode 16 and the drain electrode 17.

(Production Method for the $Ga_2O_3$ Semiconductor Element)

Next, a production method for the MESFET 10 configured as described above will be described in reference to FIGS. 3A to 3E.

The production method for the MESFET 10 includes the following sequential steps: a step of forming the high-resistivity substrate 11, a step of forming the β-$Ga_2O_3$ single crystal layer 12 on the high-resistivity substrate 11, a step of forming the channel layer 13 in the β-$Ga_2O_3$ single crystal layer 12, a step of forming the source region 14 and the drain region 15 spanning from the channel layer 13 to the β-$Ga_2O_3$ single crystal layer 12, and a step of forming the source electrode 16 on the source region 14, the drain electrode 17 on the drain region 15 and the gate electrode 18 on the channel layer 13 between the source electrode 16 and the drain electrode 17.

(Step of Forming the High-Resistivity Substrate)

Figure 3A:
FIG. 3A is a schematic explanatory cross sectional view showing a step of manufacturing the $Ga_2O_3$ MESFET in the first embodiment.

To produce a $Ga_2O_3$-based semiconductor element, firstly, the high-resistivity substrate 11 is formed by slicing and polishing, e.g., a Fe-doped high-resistivity β-$Ga_2O_3$ single crystal grown by the EFG method into a desired thickness, as shown in FIG. 3A. The principal surface of the high-resistivity substrate 11 is, e.g., the (010) plane.

(Step of Forming the β-$Ga_2O_3$ Single Crystal Layer)

Figure 3B:
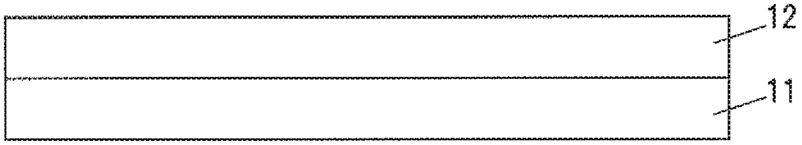
FIG. 3B is a schematic explanatory cross sectional view showing a step of manufacturing the $Ga_2O_3$ MESFET in the first embodiment.

To form the β-$Ga_2O_3$ single crystal layer 12, a β-$Ga_2O_3$ single crystal is epitaxially grown on the high-resistivity substrate 11 as a base substrate by, e.g., the HYPE method or the molecular beam epitaxy method, as shown in FIG. 3B. To obtain the undopedβ-$Ga_2O_3$ single crystal layer 12, the thickness of the β-$Ga_2O_3$ single crystal layer 12 is adjusted to, e.g., about 10 to 10000 nm.

A β-$Ga_2O_3$-based single crystal having an undoped region with a donor and/or acceptor concentration of less than $1\times10^{15}$ $cm^{-3}$ is formed by this epitaxial growth. The undoped region, if required, is doped with a trace amount of acceptor impurity at a concentration of, e.g., about $1\times10^{16}$ $cm^{-3}$.

(Step of Forming the Channel Layer)

Figure 3C:
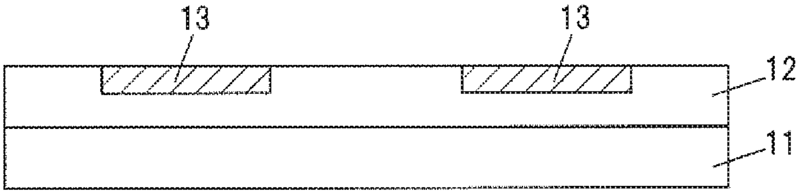
FIG. 3C is a schematic explanatory cross sectional view showing a step of manufacturing the $Ga_2O_3$ MESFET in the first embodiment.

The method of introducing the donor impurity into the β-$Ga_2O_3$ single crystal layer 12 is, e.g., ion implantation. The ion implantation method is used in this step and as shown in FIG. 3C, the channel layer 13 is formed in the β-$Ga_2O_3$ single crystal layer 12 by implanting ions of an n-type dopant such as Si into the β-$Ga_2O_3$ single crystal layer 12 in multiple stages.

To obtain a normally-on $Ga_2O_3$-based MESFET, the n-type dopant is implanted to a depth of 300 nm so that the average n-type dopant concentration is $3\times10^{17}$ $cm^{-3}$. Meanwhile, to obtain a normally-off $Ga_2O_3$-based MESFET, the n-type dopant is implanted to a depth of 300 nm so that the average n-type dopant concentration is $1\times10^{16}$ $cm^{-3}$.

(Step of Forming the Source Region and Drain Region)

Figure 3D:
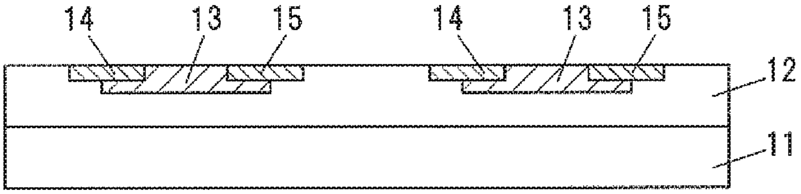
FIG. 3D is a schematic explanatory cross sectional view showing a step of manufacturing the $Ga_2O_3$ MESFET in the first embodiment.

In FIG. 3D, the source region 14 and the drain region 15 are formed by, e.g., the ion implantation method, etc. An n-type dopant such as Si or Sn is implanted by multistage ion implantation into the channel layer 13 or into a portion spanning between the channel layer 13 and the β-$Ga_2O_3$ single crystal layer 12. To obtain the source region 14 and the drain region 15 which have a higher concentration than the channel layer 13, the n-type dopant is implanted to a depth of 150 nm so that the average n-type dopant concentration is $5\times10^{19}$ $cm^{-3}$.

The n-type dopant is implanted in multiple stages into the donor impurity-doped region of the channel layer 13 using, e.g., a mask formed by photolithography. After implanting the n-type dopant in multiple stages, the n-type dopants implanted into the channel layer 13, the source region 14 and the drain region 15 are activated by activation annealing in a nitrogen atmosphere at 950° C. for 30 minutes.

(Step of Forming the Electrodes)

Figure 3E:
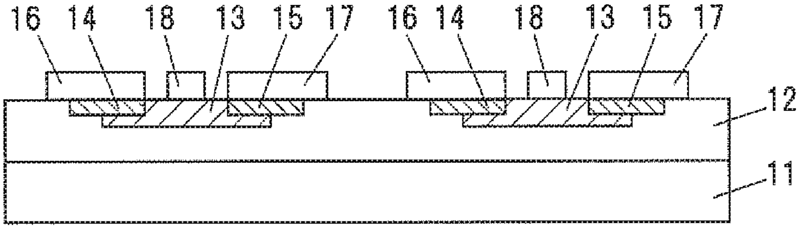
FIG. 3E is a schematic explanatory cross sectional view showing a step of manufacturing the $Ga_2O_3$ MESFET in the first embodiment.

In FIG. 3E, the source electrode 16 is formed on the source region 14 and the drain electrode 17 is formed on the drain region 15. The gate electrode 18 is formed on the channel layer 13 so as to be located between the source electrode 16 and the drain electrode 17.

The source electrode and the drain electrode are formed as follows: a mask pattern is formed on the upper surfaces of the β-$Ga_2O_3$ single crystal layer 12, the channel layer 13, the source region 14 and the drain region 15 by, e.g., photolithography, a metal film such as Ti/Au is subsequently deposited on the β-$Ga_2O_3$ single crystal layer 12, the channel layer 13, the source region 14, the drain region 15 and the entire surface of the mask pattern, and the mask pattern and the metal film except a portion in the openings of the mask pattern are removed by lift-off. The source electrode 16 and the drain electrode 17 are thereby formed.

After forming the source electrode 16 and the drain electrode 17, the electrodes are annealed in, e.g., a nitrogen atmosphere at 450° C. for 1 minute. Contact resistance between the source region 14 and the source electrode 16 and between the drain region 15 and the drain electrode 17 can be reduced by annealing the electrodes.

The gate electrode is formed as follows: a mask pattern is formed on the upper surfaces of the β-$Ga_2O_3$ single crystal layer 12, the channel layer 13, the source region 14, the drain region 15, the source electrode 16 and the drain electrode 17 by, e.g., photolithography, a metal film such as Pt/Ti/Au is subsequently deposited on the entire surface, and the mask pattern and the metal film except a portion in the opening of the mask pattern are removed by lift-off. The gate electrode 18 is thereby formed. The whole process is completed with this step.

(Effects of the First Embodiment)

The MESFET 10 configured as described above and the production method thereof in the first embodiment have the following effects in addition to the effects described above.

(1) It is possible to obtain the MESFET 10 having an element isolation structure which is not formed by element isolation technique using acceptor impurity ion implantation or a mesa process.

(2) The production time can be shorter than when produced by a method using acceptor impurity ion implantation or a mesa process and it is also possible to produce the MESFET 10 at low cost.

(3) Since the acceptor impurity diffused from the high-resistivity substrate 11 is barely contained in the channel layer 13, an increase in resistance of the channel layer 13 due to carrier compensation can be suppressed.

Second Embodiment

Figure 4A:
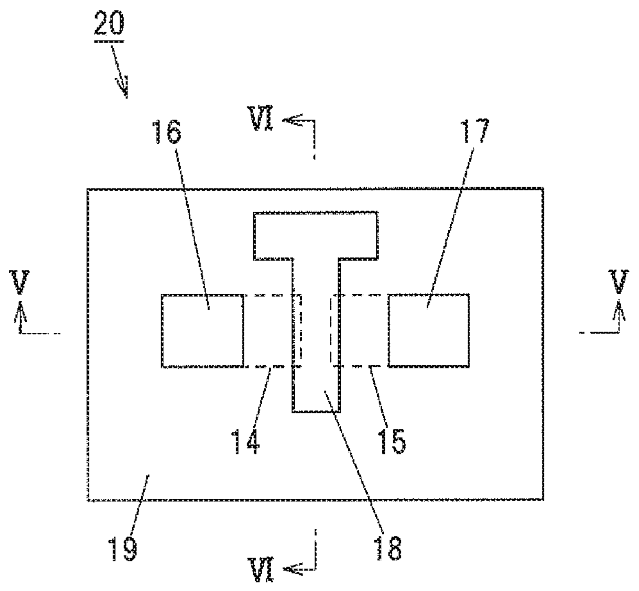
FIG. 4A is a schematic plan view showing a $Ga_2O_3$ MOSFET in a second embodiment of the invention.
Figure 4B:
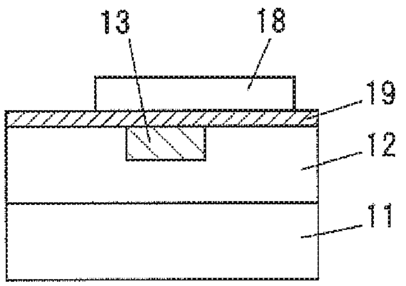
FIG. 4B is a schematic cross sectional view taken along a line IV-IV in FIG. 4A and viewed in an arrow direction.
Figure 5:
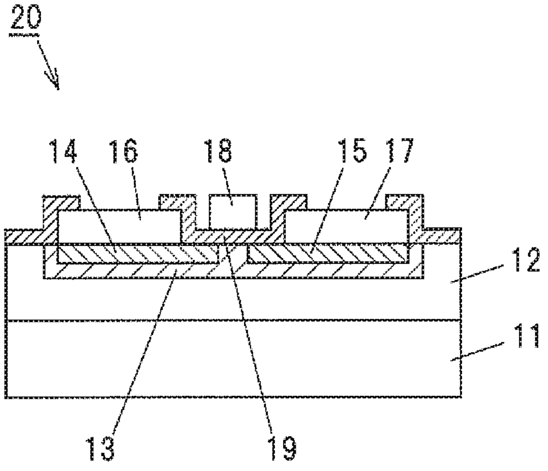
FIG. 5 is a schematic cross sectional view taken along a line V-V in FIG. 4A and viewed in an arrow direction.

FIGS. 4A to 5 show a $Ga_2O_3$-based MOSFET (Metal Oxide Semiconductor Field Effect Transistor) 20 (hereinafter, simply referred to as "MOSFET 20") as a $Ga_2O_3$ semiconductor element in the second embodiment. In these drawings, members substantially the same as those in the first embodiment are denoted by the same names and the same reference numerals. Therefore, the detailed description of such members will be omitted.

The second embodiment is different from the first embodiment in that the $Ga_2O_3$ semiconductor element is a MOSFET.

(Configuration of the $Ga_2O_3$ Semiconductor Element)

In FIGS. 4A and 4B, the surface of the β-$Ga_2O_3$ single crystal layer 12 is covered with a gate insulating film 19. The gate insulating film 19 is formed of, e.g., an insulating material such as silicon oxide ($SiO_2$) or sapphire ($Al_2O_3$). The thickness of the gate insulating film 19 is, e.g., about 20 nm.

The source electrode 16 and the drain electrode 17 are partially exposed on the surface, as shown in FIGS. 4A and 5. Meanwhile, the gate electrode 18 is formed on the channel layer 13 via the gate insulating film 19 so as to be located between the source electrode 16 and the drain electrode 17.

(Production Method for the $Ga_2O_3$ Semiconductor Element)

As shown in FIGS. 6A to 6H, the production method for the MOSFET 20 includes the following sequential steps: a step of forming the high-resistivity substrate 11, a step of forming the β-$Ga_2O_3$ single crystal layer 12, a step of forming the channel layer 13, a step of forming the source region 14 and the drain region 15, a step of forming the source electrode 16 and the drain electrode 17, a step of forming the gate insulating film 19, a step of forming the gate electrode 18 and a step of etching a portion of the gate insulating film 19.

The continuous process from the step of forming the β-$Ga_2O_3$ single crystal layer 12 to the step of forming the source electrode 16 and the drain electrode 17 is performed in the same manner as in the first embodiment. Since the continuous process from the step of forming the β-$Ga_2O_3$ single crystal layer 12 to the step of forming the source electrode 16 and the drain electrode 17 is illustrated in FIGS. 6A to 6E, the detailed explanation of the process of forming thereof will be omitted.

Figure 6A:
FIG. 6A is a schematic explanatory cross sectional view showing a step of manufacturing the $Ga_2O_3$ MOSFET in the second embodiment.
Figure 6B:
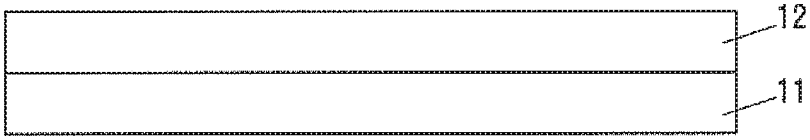
FIG. 6B is a schematic explanatory cross sectional view showing a step of manufacturing the $Ga_2O_3$ MOSFET in the second embodiment.
Figure 6C:
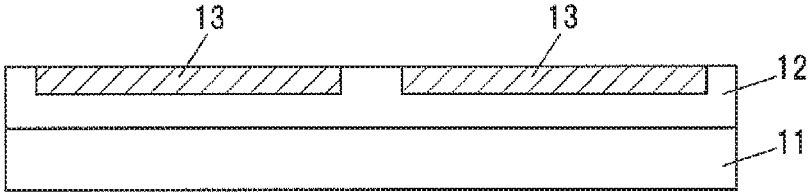
FIG. 6C is a schematic explanatory cross sectional view showing a step of manufacturing the $Ga_2O_3$ MOSFET in the second embodiment.
Figure 6D:
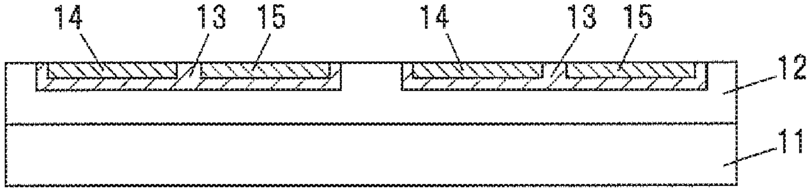
FIG. 6D is a schematic explanatory cross sectional view showing a step of manufacturing the $Ga_2O_3$ MOSFET in the second embodiment.
Figure 6E:
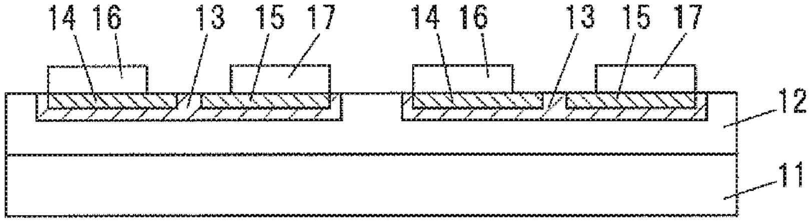
FIG. 6E is a schematic explanatory cross sectional view showing a step of manufacturing the $Ga_2O_3$ MOSFET in the second embodiment.
Figure 6F:
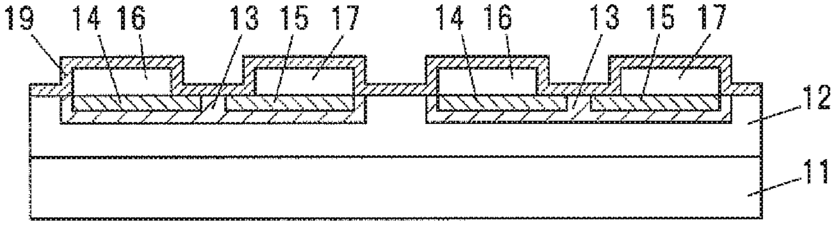
FIG. 6F is a schematic explanatory cross sectional view showing a step of manufacturing the $Ga_2O_3$ MOSFET in the second embodiment.
Figure 6G:
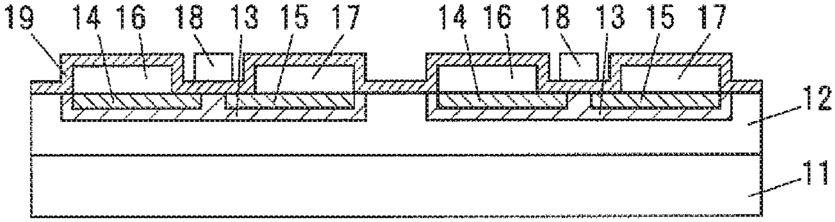
FIG. 6G is a schematic explanatory cross sectional view showing a step of manufacturing the $Ga_2O_3$ MOSFET in the second embodiment.
Figure 6H:
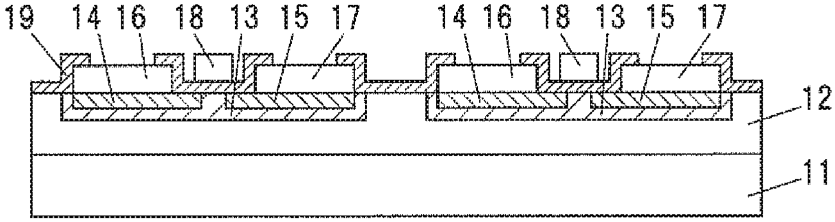
FIG. 6H is a schematic explanatory cross sectional view showing a step of manufacturing the $Ga_2O_3$ MOSFET in the second embodiment.

The second embodiment is different from the first embodiment in that as shown in FIGS. 6F to 6H, the step of forming the gate insulating film 19, the step of forming the gate electrode 18 and the step of etching a portion of the gate insulating film 19 are performed after the step of forming the source electrode 16 and the drain electrode 17.

(Step of Forming the Gate Insulating Film)

In FIG. 6F, a material consisting mainly of an oxide insulation such as $Al_2O_3$ is deposited on the entire surface on/above the β-$Ga_2O_3$ single crystal layer 12 to form the gate insulating film 19. The gate insulating film 19 is formed by, e.g., the ALD (Atomic Layer Deposition) method using an oxidant such as oxygen plasma. Alternatively, another method such as CVD method or PVD (Physical Vapor Deposition) method may be used to form the gate insulating film 19 instead of using the ALD method.

(Step of Forming the Gate Electrode)

As shown in FIG. 6G, the gate electrode 18 is formed on the gate insulating film 19 so as to be located between the source electrode 16 and the drain electrode 17. To form the gate electrode 18, a mask pattern is formed on the gate insulating film 19 by, e.g., photolithography, a metal film such as Pt/Ti/Au is subsequently deposited on the gate insulating film 19 and the mask pattern, and the mask pattern and the metal film are removed by lift-off.

(Step of Etching the Gate Insulating Film)

After forming the gate electrode 18 in FIG. 6G, the gate insulating film 19 on the source electrode 16 and the drain electrode 17 is removed by dry etching, etc., so that the source electrode 16 and the drain electrode 17 are partially exposed on the surface. The whole process is completed with this step.

(Effects of the Second Embodiment)

The same effects as those in the first embodiment are obtained also in the second embodiment.

Example

In this Example, two MOSFETs 20 of the second embodiment were formed side by side on the same substrate and the function of the undoped β-$Ga_2O_3$ single crystal layer 12 as an element isolation region was evaluated. The evaluation of the function of the element isolation region was conducted in the middle of formation of the MOSFET 20 (in the state shown in FIG. 6E).

(Configuration of the Semiconductor Device)

Figure 7:
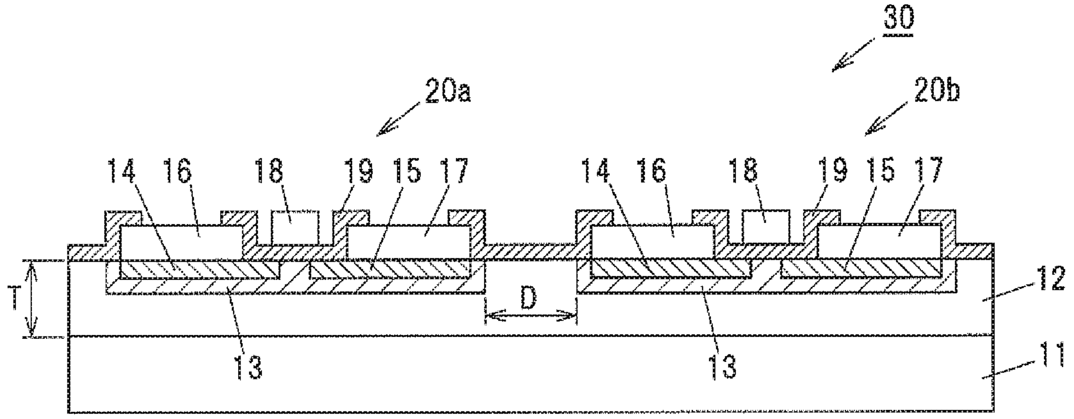
FIG. 7 is a schematic cross sectional view showing a semiconductor device in Example.

FIG. 7 is a schematic cross sectional view showing a semiconductor device 30 having two MOSFETs 20 (hereinafter, referred as MOSFETs 20*a* and 20*b*). In the semiconductor device 30, a distance D between the channel layer 13 of the MOSFET 20*a* and the channel layer 13 of the MOSFET 20*b* is 10 μm. In the MOSFETs 20*a* and 20*b*, the source region 14 and the drain region 15 in the channel layer have the fixed width in a direction perpendicular to the plane of FIG. 7 (the width in a vertical direction of FIG. 4A) which is 100 μm. This width is about several μm smaller than the width of the channel layer 13, such that the source region 14 and the drain region 15 are located on the inner side of the channel layer 13. Meanwhile, the thickness T of the β-$Ga_2O_3$ single crystal layer 12 is 0.5, 1.0 or 1.5 μm.

(Production Method for the Semiconductor Device)

Firstly, a Fe-doped high-resistivity β-$Ga_2O_3$ single crystal was grown by the EFG method. The crystal was sliced to a thickness of 1 mm so as to have the (010) plane as a principal surface, then ground/polished and lastly cleaned with organic solvent and acid, thereby making the high-resistivity substrate 11 having a thickness of 0.65 mm Next, the undoped β-$Ga_2O_3$ single crystal layer 12 was formed on the high-resistivity substrate 11 by the MBE method. A Ga metal with 99.99999% purity and a mixed gas of 95% oxygen and 5% ozone produced by an ozone generator were used as raw materials of the β-$Ga_2O_3$ single crystal layer 12. The β-$Ga_2O_3$ single crystal layer 12 was grown at a temperature of 560° C. so as to have a film thickness of 0.5, 1.0 or 1.5 μm.

Next, ion implantation was performed to form the channel layers 13 of the MOSFETs 20*a* and 20*b*. Si was selected as a donor impurity. A photoresist and an implantation mask made of $SiO_2$ were formed on the β-$Ga_2O_3$ single crystal layer 12 by photolithography so as to have openings in regions for forming the channel layers 13 and Si was subsequently implanted, thereby forming the channel layers 13 with a box profile having a Si concentration of $3\times10^{17}$ $cm^{-3}$ and a depth of 300 nm. After the implantation, the implantation mask and the photoresist thereon were removed by organic cleaning, $O_2$ ashing and buffered HF cleaning.

Next, ion implantation was performed to form the source regions 14 and the drain regions 15 of the MOSFETs 20*a* and 20*b*. An implantation mask made of $SiO_2$ was formed by photolithography and Si was subsequently implanted, thereby forming the source regions 14 and the drain regions 15 with a box profile having a Si concentration of $5\times10^{19}$ $cm^{-3}$ and a depth of 150 nm. After the implantation, the implantation mask and the photoresist thereon were removed by organic cleaning, $O_2$ ashing and buffered HF cleaning.

Next, the ion-implanted donor impurity was activated by annealing in a nitrogen atmosphere at 950° C. for 30 minutes.

Next, using the lift-off method, the source electrodes 16 and the drain electrodes 17 of the MOSFETs 20*a* and 20*b* were formed so as to have a Ti/Au two-layer structure. After forming the source electrodes 16 and the drain electrodes 17, annealing was performed in a nitrogen atmosphere at 450° C. for 1 minute to reduce contact resistance between the source electrode 16 and source region 14 and between the drain electrode 17 and the drain region 15 and to obtain good ohmic contact.

(Evaluation of Element Isolation Performance)

Current-voltage characteristics between the channel layer 13 of the MOSFET 20*a* and the channel layer 13 of the MOSFET 20*b* were measured by KEITHLEY 4200-SCS Semiconductor Parameter Analyzer and MX-1100 series Prober manufactured by Vector Semiconductor Co., Ltd. In this measurement, probes of the prober were placed on the drain electrode 17 of the MOSFET 20*a* and the source electrode 16 of the MOSFET 20*b*.

Figure 8:
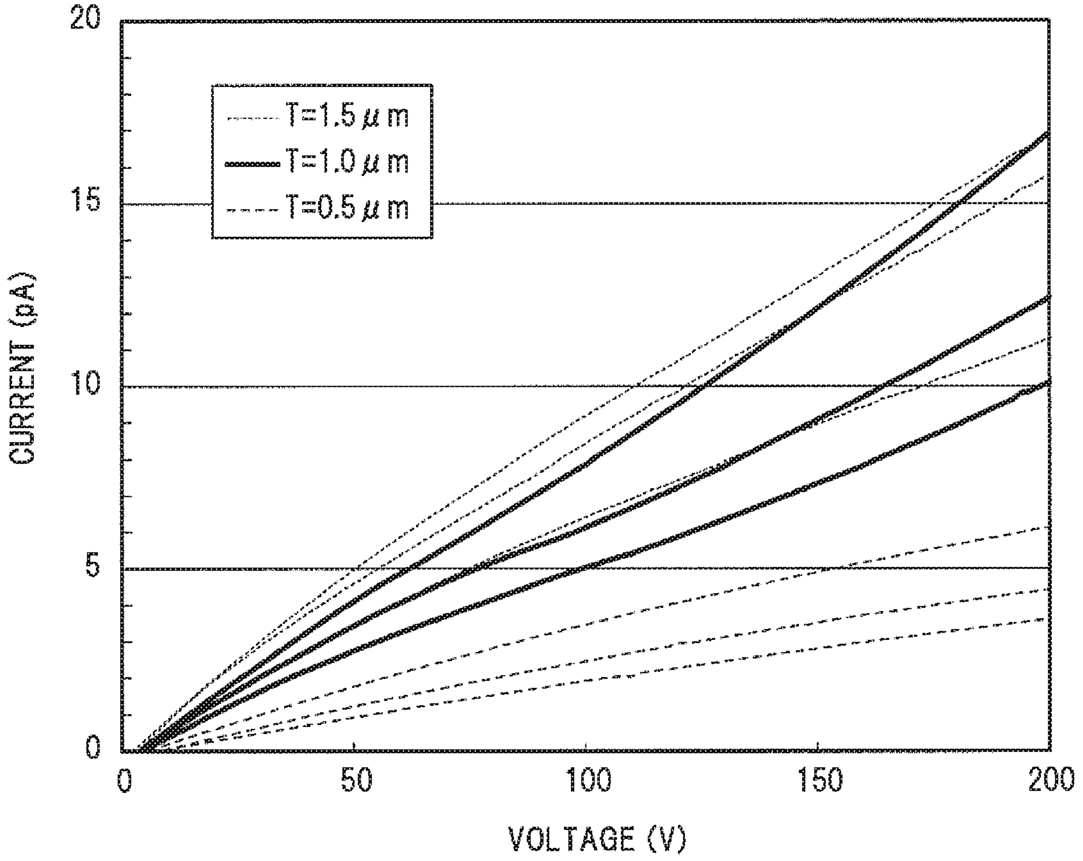
FIG. 8 is a graph showing current-voltage characteristics between channel layers in the semiconductor device in Example.

FIG. 8 is a graph showing current-voltage characteristics measured between the channel layer 13 of the MOSFET 20*a* and the channel layer 13 of the MOSFET 20*b*. FIG. 8 includes data measured at three different measurement points on each of three samples respectively having the 0.5, 1.0 or 1.5 μm-thick β-$Ga_2O_3$ single crystal layers 12.

Resistivity of the undoped β-$Ga_2O_3$ single crystal layer 12 was estimated based on the resistance value calculated from the inclination of line in FIG. 8 and the size of the undoped β-$Ga_2O_3$ single crystal layer 12 between the channel layers. As a result, resistivity of the β-$Ga_2O_3$ single crystal layer 12 was about 2 to $3\times10^{10}$ Ωcm when having the thickness T of 0.5 μm, 1 to $2\times10^{10}$ Ωcm when having the thickness T of 1.0 μm and 2 to $3\times10^{10}$ Ωcm when having the thickness T of 1.5 μm. Since the estimated resistivity does not depend on the thickness of the undoped β-$Ga_2O_3$ single crystal layer 12, the measured current is considered to be a leakage current passing through the surface, etc., of the film, not a current passing inside the undoped β-$Ga_2O_3$ single crystal layer 12. Based on this, it is presumed that the actual resistivity of the undoped β-$Ga_2O_3$ single crystal layer 12 is higher than the numerical values mentioned above.

It was found from this evaluation that the undoped β-$Ga_2O_3$ single crystal layer 12 between the channel layer 13 of the MOSFET 20*a* and the channel layer 13 of the MOSFET 20*b* functions as an element isolation region having very high insulating properties.

Also when the function of the undoped β-$Ga_2O_3$ single crystal layer 12 of the MESFET 10 in the first embodiment was evaluated by the same method, the similar result was obtained, in which the undoped β-$Ga_2O_3$ single crystal layer 12 has sufficient resistivity and functions as an element isolation region having very high insulating properties.

Although the typical embodiments, Example, modifications and illustrated examples of the invention have been described, the invention according to claims is not intended to be limited to the embodiments, Example, modifications and illustrated examples, as obvious from the above description. Therefore, it should be noted that all combinations of the features described in the embodiments, modifications and illustrated examples are not necessary to solve the problem of the invention.

INDUSTRIAL APPLICABILITY

Provided are a semiconductor element and a production method thereof which allow production steps to be simplified and production costs to be reduced.

REFERENCE SIGNS LIST

10: $Ga_2O_3$ MESFET
11: HIGH-RESISTIVITY SUBSTRATE
12: β-$Ga_2O_3$ SINGLE CRYSTAL LAYER
13: CHANNEL LAYER
14: SOURCE REGION
15: DRAIN REGION
16: SOURCE ELECTRODE
17: DRAIN ELECTRODE
18: GATE ELECTRODE
19: GATE INSULATING FILM
20: $Ga_2O_3$ MOSFET

The invention claimed is:

1. A semiconductor device, comprising:

a high resistivity substrate formed of a β-$Ga_2O_3$-based single crystal doped with an acceptor impurity;

a β-$Ga_2O_3$-based single crystal layer consisting of only one epitaxial layer formed of undoped β-$Ga_2O_3$-based single crystal on a principal surface of the high resistivity substrate; and plural of transistor elements each having a channel region buried in a surface portion of the β-$Ga_2O_3$-based single crystal layer to be spaced from each other, wherein the channel region is electrically isolated from an adjacent channel region of an adjacent transistor element by the undoped β-$Ga_2O_3$-based single crystal, and wherein the channel region is formed of a β-$Ga_2O_3$-based single crystal doped with Si.

2. The semiconductor device according to claim 1, wherein the channel region is electrically isolated from the adjacent channel region by the undoped-β-$Ga_2O_3$-based single crystal containing an unintentional donor and/or acceptor impurity at concentrations of less than $1\times10^{15}$ $cm^{-3}$.

3. The semiconductor device according to claim 1, wherein the channel region is electrically isolated from the adjacent channel region by the undoped-β-$Ga_2O_3$-based single crystal having resistivity of not less than $1\times10^{10}$ Ωcm.

4. The semiconductor device according to claim 1, wherein an average donor impurity concentration in the channel region is $3\times10^{17}$ $cm^{-3}$, and wherein the transistor elements are normally-on transistors.

5. The semiconductor device according to claim 1, wherein an average donor impurity concentration in the channel region is $1\times10^{16}$ $cm^{-3}$, and wherein the transistor elements are normally-off transistors.

6. The semiconductor device according to claim 1, wherein the channel region does not include the acceptor impurity received from the high-resistivity substrate.

7. The semiconductor device according to claim 1, wherein the high resistivity substrate is formed of a β-$Ga_2O_3$-based single crystal doped with Fe as the acceptor impurity.

8. The semiconductor device according to claim 1, wherein the β-$Ga_2O_3$-based single crystal layer is formed on a principal surface of the high resistivity substrate having a plane orientation of (001).

9. The semiconductor device according to claim 1, wherein the undoped β-$Ga_2O_3$-based single crystal contains the acceptor impurity received from the high-resistivity substrate at a concentration of less than $1\times10^{16}$ $cm^{-3}$.

* * * * *